United States Patent
Kawabata et al.

(10) Patent No.: US 7,120,050 B2
(45) Date of Patent: Oct. 10, 2006

(54) METHOD AND APPARATUS FOR SETTING OPERATIONAL INFORMATION OF A NON-VOLATILE MEMORY

(75) Inventors: Shozo Kawabata, Kasugai (JP); Mitsuhiro Nagao, Kasugai (JP); Kenta Kato, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/259,873

(22) Filed: Oct. 26, 2005

(65) Prior Publication Data

US 2006/0098496 A1 May 11, 2006

Related U.S. Application Data

(63) Continuation of application No. PCT/JP04/15830, filed on Oct. 26, 2004.

(51) Int. Cl.
*G11C 16/04* (2006.01)
(52) U.S. Cl. .............................. 365/185.01; 365/189.05
(58) Field of Classification Search ............ 365/185.01, 365/189.05, 185.04, 185.33
See application file for complete search history.

(56) References Cited

U.S. PATENT DOCUMENTS

| | | | |
|---|---|---|---|
| 5,511,211 A * | 4/1996 | Akao et al. ..................... 712/36 |
| 6,088,281 A | 7/2000 | Miyakawa et al. |
| 6,556,479 B1 | 4/2003 | Makuta et al. |
| 6,643,180 B1 * | 11/2003 | Ikehashi et al. ........ 365/185.22 |

FOREIGN PATENT DOCUMENTS

| | | |
|---|---|---|
| JP | 05-128892 | 5/1993 |
| JP | 08-125914 | 5/1996 |
| JP | 2002-015584 | 1/2002 |
| JP | 2002-117699 | 4/2002 |
| JP | 2003-044457 | 2/2003 |
| JP | 2003-132688 | 5/2003 |
| JP | 2004-039055 | 2/2004 |
| JP | 2004-342187 | 12/2004 |

* cited by examiner

*Primary Examiner*—Vu A. Le
(74) *Attorney, Agent, or Firm*—Ingrassia Fisher & Lorenz, P.C.

(57) ABSTRACT

A verify sense amplifier (19) reads data from a non-volatile memory cell to be rewritten. The readout data is compared to expected data in a comparator circuit (21). Upon completion of rewriting, the comparator circuit (21) outputs a match signal MCH. A selector (23) outputs a decode signal STR(i) or SWP(i) indicative of a volatile data retaining unit (25), in correspondence with the non-volatile memory cell MC to be rewritten. According to a verify instruction signal PGV/ERV, the readout data read by the verify sense amplifier (19) is stored in the volatile data retaining unit (25). Control is performed with a match signal MCH instead of the verify instruction signal PGV/ERV, thereby storing the data in the volatile data retaining unit (25) upon completion of rewriting. Therefore, there is no need to re-read operational information from the non-volatile storage.

15 Claims, 14 Drawing Sheets

FIG. 12

| SECTOR NO. | 0~15 | 16~31 | 32~47 | 48~63 | 64~79 | 80~95 | 96~111 | 112~127 |
|---|---|---|---|---|---|---|---|---|
| SEL_Y(i) | 0 | 1 | 2 | 3 | 4 | 5 | 6 | 7 |
| SA(6) | 0 | 0 | 0 | 0 | 1 | 1 | 1 | 1 |
| SA(5) | 0 | 0 | 1 | 1 | 0 | 0 | 1 | 1 |
| SA(4) | 0 | 1 | 0 | 1 | 0 | 1 | 0 | 1 |

| | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| SA(3) | 0 | 0 | 0 | 0 | 0 | 0 | 0 | 0 | 1 | 1 | 1 | 1 | 1 | 1 | 1 | 1 |
| SA(2) | 0 | 0 | 0 | 0 | 1 | 1 | 1 | 1 | 0 | 0 | 0 | 0 | 1 | 1 | 1 | 1 |
| SA(1) | 0 | 0 | 1 | 1 | 0 | 0 | 1 | 1 | 0 | 0 | 1 | 1 | 0 | 0 | 1 | 1 |
| SA(0) | 0 | 1 | 0 | 1 | 0 | 1 | 0 | 1 | 0 | 1 | 0 | 1 | 0 | 1 | 0 | 1 |

FIG. 13

| TRIMMING NO. | 0~15 | 16~31 | 32~47 | 48~63 | 64~79 | 80~95 | 96~111 | 112~127 |
|---|---|---|---|---|---|---|---|---|
| SEL_Y(i) | 0 | 1 | 2 | 3 | 4 | 5 | 6 | 7 |
| SA(6) | 0 | 0 | 0 | 0 | 1 | 1 | 1 | 1 |
| SA(5) | 0 | 0 | 1 | 1 | 0 | 0 | 1 | 1 |
| SA(4) | 0 | 1 | 0 | 1 | 0 | 1 | 0 | 1 |

| | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| SA(3) | 0 | 0 | 0 | 0 | 0 | 0 | 0 | 0 | 1 | 1 | 1 | 1 | 1 | 1 | 1 | 1 |
| SA(2) | 0 | 0 | 0 | 0 | 1 | 1 | 1 | 1 | 0 | 0 | 0 | 0 | 1 | 1 | 1 | 1 |
| SA(1) | 0 | 0 | 1 | 1 | 0 | 0 | 1 | 1 | 0 | 0 | 1 | 1 | 0 | 0 | 1 | 1 |
| SA(0) | 0 | 1 | 0 | 1 | 0 | 1 | 0 | 1 | 0 | 1 | 0 | 1 | 0 | 1 | 0 | 1 |

*1: SEQUENTIAL READING FROM NON-VOLATILE STORAGE

*2: SELECTION OF & WRITING IN ASSOCIATED VOLATILE STORAGES (PROGRAMMING OF OPERATION INFO OF SECTOR 0)

(BUNCH ERASING OF OPERATION INFO OF SECTORS)

METHOD AND APPARATUS FOR SETTING OPERATIONAL INFORMATION OF A NON-VOLATILE MEMORY

CROSS-REFERENCES TO RELATED APPLICATIONS

This is a continuation of International Application No. PCT/JP2004/015830, filed Oct. 26, 2004 which was not published in English under PCT Article 21(2).

TECHNICAL FIELD OF THE INVENTION

The present invention relates to a method of setting operational information in a non-volatile memory and, more particularly, relates to a technique for storing operational information in a non-volatile storage area and storing it in a volatile storage area while power is supplied.

BACKGROUND ART OF THE INVENTION

In the semiconductor device disclosed in Japanese unexamined patent publication No. 2002-117699 (Patent Document 1), an initial setting data area for storing initial settings is provided for a memory cell array 110 composed of electrically rewritable non-volatile memory cells, as shown in FIG. 7. A bad column address register 190 is provided for storing bad column addresses corresponding to bad columns which occurred in the memory cell array 110. In addition, trimming data registers 210, 230 are provided for storing adjustment data used for generating various voltages in an internal voltage generator circuit 200 and adjustment data used for generating various timing pulses in a timer circuit 220, respectively.

As a result of wafer test, adjustment data for various voltages generated in the internal voltage generator circuit 200 and adjustment data for various timing pulses generated in the timer circuit 220 are set in the trimming data registers 210, 230, and bad column addresses are set in the bad column address register 190.

The data in the trimming data registers 210, 230 and in the bad column address register 190 are stored as initial settings in the initial setting data area of the memory cell array 110 composed of non-volatile memory cells.

In the image input device disclosed in Japanese unexamined patent publication No. H08(1996)-125914 (Patent Document 2), when the power switch is turned ON to supply system power, a check is made to determine whether a request for updating control information has been input from a remote control unit or externally connected computer, as shown in FIG. 8 (S100 and S200). If an update request has been made, control information stored in RAM is updated or new control information is stored in the RAM, and data on execution of the updating is stored in a specified location of the RAM (S300).

When the power source is turned OFF, the RAM is examined to determine the presence or absence of updated control information (S500). If updating has been done, the control information stored in the RAM is then written into an EEPROM (S600). A voltage retaining circuit is designed to maintain a system power source voltage for a certain period of time until at least the process S600 is completed after turning-OFF of the power switch.

DISCLOSURE OF THE INVENTION

Problems that the Invention Solves

Patent Documents 1, 2 are associated with techniques for writing various settings and control information in the memory cell array 110 or EEPROM according to need, after storing them in various registers such as the trimming data registers 210, 230 and the bad column address register 190, or the RAM (S300).

However, these techniques sometimes require a lot of time because the memory cell array 110 and EEPROM are constituted by non-volatile memory cells and repetitive application of specified bias voltage is required for rewriting data. As a result, conflicts between the settings/control information stored in the registers and RAM and the settings/control information stored in the memory cell array 110 and EEPROM continue until the settings/control information of the registers and RAM are stored in the memory cell array 110 and EEPROM. If rewriting of data in the non-volatile memory cells is prolonged, there is a likelihood of long-term continuation of conflicts concerning settings and control information. This is problematic because an unstable condition in terms of circuit operation will continue for a prolonged period of time.

Regarding rewriting of data into the non-volatile memory cells, the program operation (i.e., rewriting for changing data to "0") differs from the erasing operation (i.e., rewriting for changing data to "1") in terms of bias voltage applied to the non-volatile memory cells, a reference threshold voltage used in the verification operation for judging a rewriting condition, and the operational sequence of rewriting. Therefore, if rewriting involves both changing from data "1" to data "0" and changing from data "0" to data "1", the program operation and the erasing operation have to be carried out, thereby further prolonging the rewriting time. This leads to additional time in the state where conflicts concerning settings and control information exist and, in consequence, an unstable condition with regard to circuit operation which continues for a longer period of time.

Patent Document 1 is associated with a technique for storing trimming information (e.g., internal setting voltage and timing pulses) and redundant address information (e.g., defective column addresses) in non-volatile memory cells by the vender when a wafer test is made before delivery. However, it does not make mention of configuration information defined by the user (e.g., write protection information). Application of the technique of Patent Document 1 to user configuration information causes the problem that a period during which a conflict concerning user configuration information exists between various registers and the non-volatile memory cells exists too long.

According to Patent Document 2, updating of control information is accepted as requested, whereas storing of updated control information in the EEPROM is done when the power source is shut off. Therefore, a voltage retaining circuit is provided to continue supplying power after shut off of the power source. This, however, leads to the drawback that, in order to supply power after shut off of the power source, capacitance elements and other elements are required to stock energy, thereby adding an additional requirement for a circuit for keeping voltage to a specified voltage value while power is supplied. It is anticipated that supplying power long-term becomes necessary depending on the time required for storing data in the EEPROM and the volume of information to be stored. This brings about the problem that capacitance and other elements of good size and a regulator circuit and other circuits for maintaining a specified voltage value are additionally required, resulting in larger circuit scale and increased current consumption.

It is also anticipated that settings/control information may be transferred to a volatile data storage such as RAM and registers, after writing it in non-volatile storage area. In this case, readout access control is necessary for reading the settings/control information from the non-volatile storage area. That is, there arises a requirement for readout time for re-reading the settings/control information from the non-volatile storage area after it has been written therein and before it is stored in the volatile data storage. This causes a delay in updating the settings/control information stored in the volatile data storage.

Means for Solving the Problems

The present invention is directed to overcoming at least one of the problems described in the BACKGROUND ART and a primary object of the invention is therefore to provide a method of setting information of a non-volatile memory and a non-volatile memory, in which operational information for the non-volatile memory is stored in a non-volatile storage area and, while power is supplied, the same operational information as stored in the non-volatile storage area is set and stored in a volatile data storage area, the method and non-volatile memory being characterized in that when setting or updating the operational information, the operational information can be stored in the volatile data storage area without delay, without requiring rewriting of the non-volatile storage area.

To achieve the above object, according to the present invention there is provided a method of setting information of a non-volatile memory that comprises non-volatile storage in which operational information is stored and volatile storage in which the operational information stored in the non-volatile storage is stored while power is supplied, the method of setting information of the non-volatile memory comprising the steps of: rewriting the non-volatile storage when the operational information is set or updated, and storing the operational information in the volatile storage based on a logical signal corresponding to the operational information that is retained so that a logical process can be executed when the step of rewriting ends.

According to another aspect of the invention, there is provided a non-volatile memory comprising: nonvolatile storage wherein operational information is stored and, when the operational information is set or updated, the operational information is rewritten; volatile storage coupled to the nonvolatile storage for storing the operational information therein while power is supplied to the non-volatile memory; and a discrimination unit that outputs a logical signal on which a logical process can be done according to the operational information when rewriting of the non-volatile storage ends, wherein the discrimination unit is coupled to the volatile storage and the operational information is stored in the volatile storage based on the logical signal outputted by the discrimination unit.

In the method of setting the information of the non-volatile memory and the non-volatile memory according to the invention, the non-volatile memory has non-volatile storage for storing operational information and volatile storage for storing the operational information stored in the non-volatile storage while power is supplied. For setting or updating the operational information, rewriting of the non-volatile storage is first performed and upon completion of the rewriting, a logical signal corresponding to the set or updated operational information is retained so as to be logically processable. Based on the logical signal, the operational information is stored in the volatile storage. In this case, the logical signal is output by a discrimination unit in response to the operational information.

Effects of the Invention

According to the invention, since the operational information to be set or updated is first stored in the non-volatile storage and upon completion of the storing therein, a logical signal corresponding to the operational information is retained so as to be logically processable, it is unnecessary to perform anew access operations for reading the operational information from the non-volatile storage when storing the operational information of the non-volatile storage in the volatile storage. As a result, a series of operational information setting/updating processes composed of the steps of storing operational information in the non-volatile storage and storing the operational information in the volatile storage can be quickly performed.

Operating conditions for the non-volatile memory while supplying power are set according to the operational information stored in the volatile storage. When changing the operational information while supplying power, the contents of the volatile storage can be updated after storing the operational information in the non-volatile storage, thereby immediately adjusting the operation of the circuit. This not only solves the problems that, (a) when altering the contents of the volatile storage, the time where the contents of the volatile storage and the contents of the non-volatile storage are in conflict becomes prolonged and (b) rewriting the non-volatile storage after shut off of the power source is required, but also enables alteration of the operational information without delay, resulting in quick alteration of operating conditions.

In addition, when setting or updating the operational information, there is no need to newly read the operational information to be stored in the volatile storage from the non-volatile storage, thereby saving current consumption caused by the readout access operation, resulting in reduced current consumption during the process of setting or updating the operational information.

BRIEF DESCRIPTION OF DRAWINGS

FIG. 12 is a look-up table showing sector addresses, second type operational information and the memory cells of non-volatile storage.

FIG. 13 is a look-up table showing the sector addresses, first type operational information and the memory cells of the non-volatile storage.

DETAILED DESCRIPTION OF THE INVENTION

Figure 1:
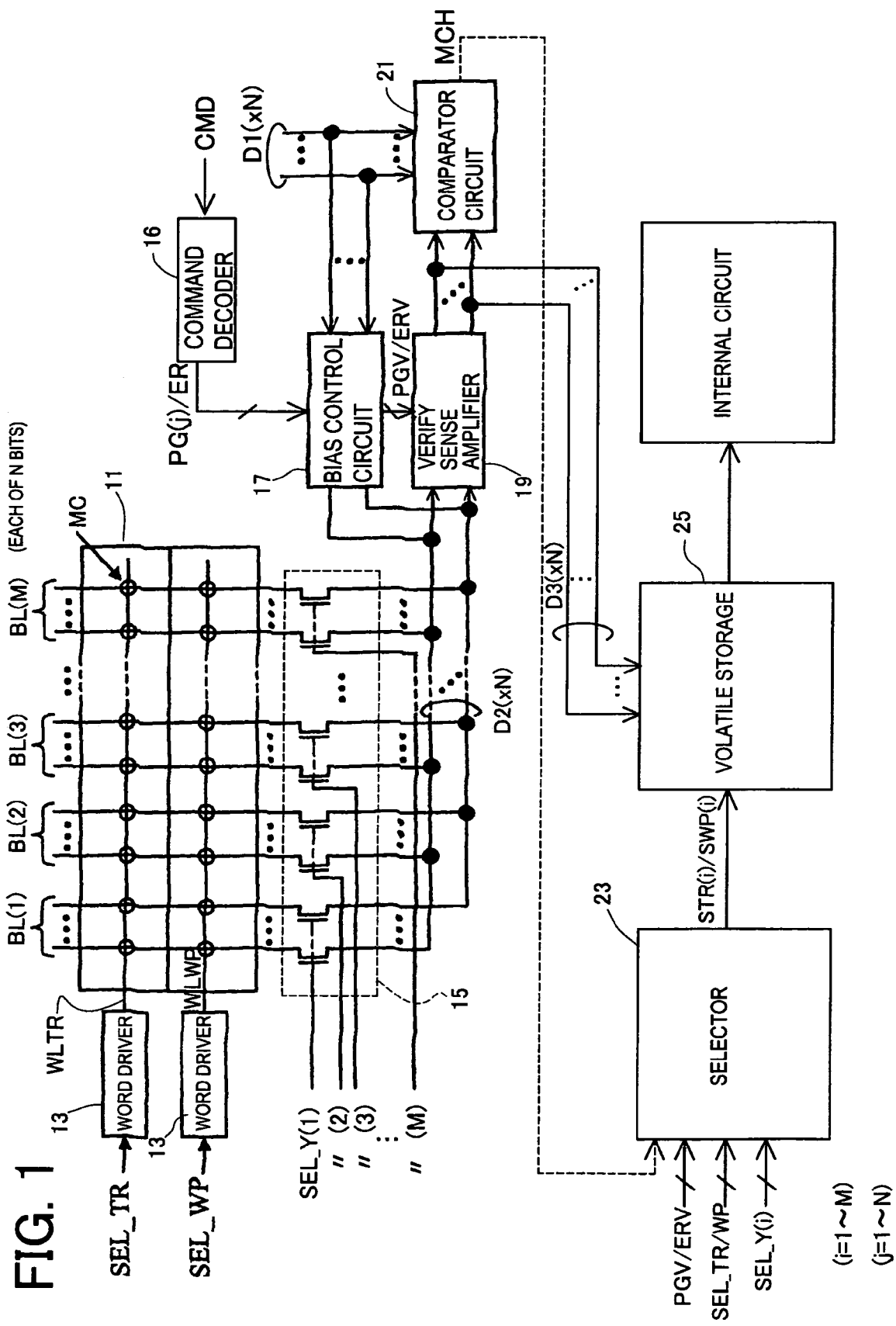
FIG. 1 is a circuit block diagram according to a first embodiment.

Reference is now made to FIGS. 1 to 6 and FIGS. 9 to 16 to describe a method and apparatus of setting the operational information of a non-volatile memory in accordance with preferred embodiments of the invention.

In a non-volatile memory, operating conditions are set according to various kinds of operational information while the circuit is operated. There are two primary types of operational information.

The first type of operational information is stored by the vendor at the factory and is necessary for the non-volatile memory to perform specified operations. Examples of the first type of operational information include: (i) information for adjustment of bias voltage values used in various operations such as program operation, erasing operation and readout operation; (ii) information for adjustment of timings in these operations; (iii) information for adjustment of the oscillating frequency of a built-in oscillator; and (iv) redundant address information for a redundancy scheme of defective memory cells. Such operational information is defined during test procedures prior to shipment.

The second type of operational information is set up by the user according to a status of use and necessary for customizing a non-volatile memory in accordance with the function of the system in which the non-volatile memory is incorporated. For instance, the following operational information is possible: (i) the memory cell array of the non-volatile memory is divided into specified areas and whether or not rewriting is possible for each area is determined and stored as operational information and (ii) write protection is set up for every so-called sector or every group of sectors and stored as operational information. It is also possible to set up operational information to allow or prevent rewriting the operational information. Additional operational information could be set, in order to limit the free degree of rewriting, a function which allows rewriting only when a specified code is input and accepted. These functions and the specified code are set by the user.

In a non-volatile memory, it is necessary to maintain the above types of operational information after shut off of the power source. Unless the first type of operational information is maintained, circuit operation according to factory defaults cannot be preserved so that problems such as performance deterioration or inoperative situations are likely to occur. If the second type of operational information is not maintained, it could lead to a failure in the performance and function of the system in which the non-volatile memory is installed. Therefore, the operational information set by the vendor or user needs to be stored in the non-volatile storage.

The operational information stored in the non-volatile storage is appropriately looked up according to the operational state of the non-volatile memory, resulting in desired circuit operation. Such operational information has to be looked up whenever the power source is turned ON to ensure desired operating conditions and set without delay in accordance with the operational state.

The first type of operational information is associated with adjustment of bias voltage values, adjustment of operation timings, adjustment of the oscillating frequency of built-in oscillators, redundant address information, etc. Circuit constants need to be determined upon turning ON of the power source. The internal voltage generation circuit, various timing circuits, and the built-in oscillator need to be provided with various circuit constants immediately upon turning ON of the power source so that they can assume adjusted voltage values, operating timings and oscillating frequency. Regarding the redundant address information, it is advisable to determine quickly whether the redundancy scheme is possible for input address information and therefore redundant address information on defective memory cells needs to be provided immediately upon turning ON of the power source.

The second type of operational information is associated with information such as write protection information, rewriting limitation information, and specified code information for giving rewriting permission. It is desirable that such operational information be provided instantaneously in response to a corresponding access.

For the above reason, some non-volatile memories employ two-stage configurations composed of non-volatile storage and volatile storage to store the operational information. The non-volatile storage is provided to store the operational information even after turning OFF the power source. When power is supplied, the operational information is transferred from the non-volatile storage to the volatile storage so that it can instantaneously be provided for circuit operation. This transfer is done in response to either turning ON the power source or resetting operation for initializing the non-volatile memory. While power is supplied, various operating conditions are determined based on the operational information stored in the volatile storage. In addition, when the operational information stored in the non-volatile storage is updated (altered) during a period when power is being supplied, the updated operational information input is first stored in the non-volatile memory (this means that the information stored in the memory cells of the non-volatile storage is updated before storing) and then the same updated information is stored in the volatile storage. Therefore, if the operational information is updated during a period that power is supplied, various operating conditions will thereafter be determined based on the updated operational information stored in the volatile storage.

This has the effect that, in the non-volatile memory, during circuit operation after turning ON of the power source or each time operation is requested during circuit operation, the operational information is looked up without delay so that desired circuit operation can be performed.

The two-stage memory configuration, which is composed of non-volatile storage and volatile storage and provided for a non-volatile memory, has the following features. The two-stage memory configuration has an intention different from that of a cache system which has a multilevel memory configuration composed of a main memory and a cache memory in a computer system, so that the two-stage memory configuration has functions and effects differing from those of the cache system. The main memory is constituted by a memory such as DRAM, whereas the cache memory is constituted by a memory such as SRAM. Generally, these memories consist of volatile memories.

A multilevel memory system in a computer system is so configured as to realize high-speed memory access. A part of the main memory is provided with a cache memory such as SRAM capable of high-speed access and high-speed data readout/write-in. If the movement of access area or the amount of data written into the cache memory reaches a specified level, reading of data from a new data area of the main memory is implemented and the contents of the cache memory are written into the main memory, with appropriate timing. Upon request of access from outside of the memory device, if this request matches the address space retained by the cache memory, the cache memory is connected to an external I/O so that high-speed access is enabled. For this reason, the cache memory is coupled to the external I/O.

In contrast with the above memory system, the two-stage memory configuration provided for the non-volatile memory has the following features.

In the two-stage memory configuration, non-volatile storage is provided in order to maintain the operational information after shut off of the power source, whereas high-speed operation is enabled during a power supply period. However, the access speed of the non-volatile storage is not high enough in some cases to support circuit operation. Volatile storage is thus provided to compensate for the limited access speed of the non-volatile storage. Therefore, the two-stage memory configuration is composed of the non-volatile storage capable of maintaining the operational information after shut off of the power source and the volatile storage capable of supplying the operational information to the internal circuit at high speeds when power is supplied.

The same operational information is stored in the non-volatile storage irrespective of the ON/OFF state of the power source and after turning the power source ON, the operational information is transferred to the volatile storage to be used for determining the operating condition of circuit operation. Therefore, the non-volatile storage for storing the operational information and the volatile storage for storing the operational information have the same memory capacity.

The flow of setting or updating the operational information is fixed such that the operational information is first stored in the non-volatile storage and then stored in the volatile storage. The time required for rewriting the operational information of the non-volatile storage is longer than the time required for rewriting the volatile storage. The reason for this is that the non-volatile storage has a physical data storage mechanism, for instance, charge injection and discharge with respect to the floating gates of the non-volatile memory cells, whereas the volatile storage has an electrical storage mechanism. According to the above unidirectional flow of setting or updating, the set or updated operational information stored in the volatile storage is applied to circuit operation after completion of storing the operational information into the non-volatile storage, which eliminates the period during which the contents of the non-volatile storage conflict with the contents of the volatile storage, so that erroneous circuit operation can be avoided. In compliance with the above unidirectional flow of setting or updating, the volatile storage is not connected to the external I/O but receives all set or updated items of information from the non-volatile storage. The internal circuit which needs the operational information, receives the operational information output from the volatile storage.

The above non-volatile memory differs from the cache system in that the former has the two-stage memory configuration composed of non-volatile storage and volatile storage, while the latter employs multiple volatile memories. In addition, while the non-volatile memory is such that the non-volatile storage and the volatile storage have the same memory capacity, the cache system is such that a part of the main memory is the cache memory. Further, while the non-volatile memory is such that the flow of setting or updating operational information is unidirectional, that is, from the non-volatile storage to the volatile storage, the cache system is such that information is bidirectionally transferred between the main memory and the cache memory. Further, while the non-volatile memory is such that the non-volatile storage is connected to the external I/O and the volatile storage is not connected to the external I/O, the cache system is such that the cache and the main memory are both connected to the external I/O.

The non-volatile storage for storing operational information may have the same non-volatile memory cell configuration as that of the memory cell array of the non-volatile memory, which memory cell array is address space serving as a storage area required by the user. In this case, the non-volatile storage may be placed in the same area as that of the non-volatile memory or placed in an area different from that of the non-volatile memory. Being placed in the same area means sharing, for instance, a well region. Sharing an allocation area eliminates a need for a boundary between the non-volatile storage and the memory cell array of the non-volatile memory so that they can be arranged in a compact space. For the non-volatile memory cells of the non-volatile storage and the non-volatile memory cells of the memory cell array, it is possible to employ a configuration in which bit lines and word lines are separated or a configuration in which bit lines and word lines are formed by common lines. If the configuration in which the bit lines and/or word lines are separated is employed, the non-volatile storage and the memory cell array can independently have simultaneous access. Specifically, operational information to be stored in the non-volatile storage can be updated without stopping normal access to an address space which serves as a storage area used by the user. If the configuration in which the bit/word lines are formed by common lines is employed, the row/column decoder, readout/rewrite control unit, etc. can be shared by the non-volatile storage and the memory cell array and, therefore, improved integration can be achieved.

The volatile storage may use a latching circuit and a register circuit. Where the volatile storage is constituted by a latching circuit and/or a register circuit, it can be disposed in the vicinity of a circuit block which requires operational information so that operational information can be read out and output at any time. This arrangement is suitably used for storing operational information such as circuit constants and redundant addresses which are the first type operational information constantly referred to during a power supply period after turning ON of the power source in order to ensure desired operating conditions. The latching circuit and the register circuit are arranged in a peripheral circuit area in which a circuit block composed of a logical control circuit for controlling the memory cell array of the non-volatile memory is disposed. The layout pattern of the elements of the peripheral circuit area is wider in line width and space width than the memory cells. The reason for this is that the memory cells have the redundancy function, whereas the logical control circuitry is not equipped with the redundancy function. Therefore, the latching circuit and the register circuit are laid out with larger line width and space width.

If the volatile storage has RAM configuration in which volatile memory cells are arranged in an array by word lines and bit lines and reading and writing of data are affected according to address assignment, it can be suitably applied to cases where large amounts of operational information data are stored. In cases where the number of areas where the write protection function is set increases as the non-volatile memory has larger capacity and the number of mounted sectors increases, the write protection information which is the second type operational information can be stored in the RAM. In this case, it is advisable that the RAM configuration has a fine-pitch layout pattern (which is substantially equivalent to the memory cell array of a non-volatile memory) such as SRAM. Since the number of bits of the operational information is much less than the number of memory cells in the non-volatile memory, the redundancy function is substantially unnecessary for SRAM in view of defect density. Further, if SRAM is arranged in the peripheral circuit, it can feed the operational information at high speed to a circuit which requires the operational information. Since the element area of SRAM is much smaller than the latching circuit and the register circuit which are laid out with large line width and space width, a reduced die size can be achieved.

When rewriting the non-volatile memory cells which constitute the non-volatile storage with new operational information, the program operation or the erasing operation is affected. These rewriting operations are carried out by fluctuations in the threshold voltage of the non-volatile memory cells, the fluctuations being caused by discharge/charge injection of the floating gates through bias application to the respective terminals of the non-volatile memory cells. Discharge/charge injection is performed, utilizing physical phenomenon such as Fowler-Nordheim tunneling phenomenon and hot electron injection phenomenon. Desired threshold fluctuations cannot be obtained by one bias application. Generally, bias application is done more than once to accomplish discharging and charge injection due to the variation width of the threshold voltage caused by bias application fluctuates according to variations in the characteristics of the non-volatile memory cells. Generally, verification operations for identifying the rewriting condition are performed each time a bias application is finished. The rewriting condition is judged by reading out data stored in the non-volatile memory cells to be rewritten (candidates for rewriting) through the verification operation.

The first embodiment shown in FIG. 1 is associated with a case where data read from the non-volatile memory cells to be rewritten are stored in the volatile storage during the verification operation which is done each time the rewriting operation is performed on the non-volatile storage. Storing of data in the volatile storage is performed based on a logical signal sent from a verify sense amplifier whenever the verification operation is performed after the rewriting operation, the logical signal corresponding to the operational information which is repeatedly retained so as to be logically processable. Alternatively, storing of data in the volatile storage is performed based on a logical signal sent from a verify sense amplifier when the verification is successful, the logical signal corresponding to the operational information retained so as to be logically processable.

In the non-volatile storage 11, non-volatile memory cells MC are aligned in row and column directions, forming a matrix. A plurality of non-volatile memory cells MC selectively controlled are aligned, in the row direction, on each of word lines WLTR, WLWP driven by word drivers 13. In the first embodiment, the word drivers 13 are controlled in response to selection signals SEL_TR and SEL_WP. When the word line WLTR is activated by the selection signal SEL_TR, trimming information for adjusting the operating condition of circuit operation is stored in the non-volatile memory cells MC selected by the word line WLTR. Likewise, the word line WLWP is activated by the selection signal SEL_WP and write protection information for permitting/preventing rewriting of a specified area (not shown) of the memory cell array (e.g., sectors) is stored in the non-volatile memory cells MC selected by the word line WLWP.

The non-volatile memory cells MC in a same column are connected by a bit line extending in the column direction. The bit lines are divided into bit line groups BL(1) to BL(M) each constituted by N bit lines and serving as a basic unit for access. The bit line groups BL(1) to BL(M) are connected to a data line D2 of N bit width through a Y decoder 15. The Y decoder 15 has an NMOS transistor group for each of the bit line groups BL(1) to BL(M). The NMOS transistor groups connect the decoder 15 to the data line D2 of N bit width. The NMOS transistor groups of the Y decoder 15 are controlled by Y decode signals SEL_Y(1) to SEL_Y(M) such that they are independently brought into a conductive state, thereby connecting any one of the bit line groups BL(1) to BL(M) to the data line D2.

The data line D2 is connected to a readout sense amplifier (not shown) for readout access to data and connected to a data line D1 leading to a data terminal through a bias control circuit 17. The data line D2 is also connected to a verify sense amplifier 19.

The bias control circuit 17 is a control circuit for instructing, in response to a program instruction signal PG(j) (j=1 to N) or an erase instruction signal ER, whether a rewriting operation mode designates the program operation or the erasing operation and for applying a bias voltage from the data line D2 to the drain terminals of the non-volatile memory cells MC through the bit lines. The program instruction signal PG(j) and the erase instruction signal ER are output from a command decoder 16. After a command signal CMD is input to the command decoder 16 from outside, the command signal CMD is decoded so that the program instruction signal PG(j) or the erase instruction signal ER is output.

During the program operation, a bit position designating where the program operation is to be performed on a data expected value which has been input to the data line D1, is determined, and according to the position of the corresponding bit line of the corresponding bit line group, the program instruction signal PG(j) (j=1 to N) is activated. Thereby, bias voltage is applied to the corresponding data line D2. During the erasing operation, since batch erasing is performed, bias voltage is applied commonly to the data lines D2 of N bit width. After the bias voltage has been applied for a specified time, a verify instruction signal PGV/ERV is output to the verify sense amplifier 19.

The verify sense amplifier 19 amplifies storage information which has been read out to the data line D2 through the Y decoder 15 and stored in the non-volatile memory cells MC being rewritten. In response to the verify instruction signal PGV for the program operation or the verify instruction signal ERV for the erasing operation which has been output from the bias control circuit 17 each time application of the bias voltage is complete, reference memory cells each having a corresponding threshold voltage are selected and the readout data is amplified.

The amplified data is input to a comparator circuit 21 and a volatile storage 25 through a data line D3. Expected data is input to the comparator circuit 21 through the data line D1 and compared to the readout data which has been amplified by and output from the verify sense amplifier 19. If the readout data matches the expected data after completion of rewriting, the comparator circuit 21 then outputs a match signal MCH.

Data read from the non-volatile memory cells MC is stored in the storage area of the volatile storage 25 through the data line D3, the storage area being selected by a selector 23. Input to the selector 23 is the verify instruction signal PGV/ERV generated in the program operation/erasing operation, the selection signal SEL_TR or SEL_WP and the Y decode signal SEL_Y(i) (I=1 to M). For every non-volatile memory cell MC connected to the bit line group BL(i) of the non-volatile storage 11 which has been selected by the selection signal SEL_TR or SEL_WP and the Y decode signal SEL_Y(i), a decode signal STR(i) or SWP(i) indicative of a storage position of the volatile storage 25 is output from the selector 23. In this case, the decode signal STR(i) or SWP(i) is output in response to the verify instruction signal PGV/ERV. By outputting the verify instruction signal PGV/ERV, the readout data (i.e., the logical signal corresponding to the operational information retained so as to be logically processable) amplified by the verify sense amplifier 19 is stored in the volatile storage 25.

In place of or in addition to the verify instruction signal PGV/ERV, the match signal MCH output from the comparator circuit 21 may be input. Thereby, the rewriting operation is completed and if the storage information stored in each non-volatile memory cell MC to be rewritten matches the expected data, the decode signal STR(i)/SWP(i) is output. Storing of operational information in the volatile storage 25 is performed once upon completion of rewriting and unnecessary storage operation is not required. Therefore, unnecessary circuit operation can be prevented, reducing current consumption.

In FIG. 1, "i" (=1 to M) indicates the number of bit line groups BL(i). For example, eight groups (M=8) may be used. "j" represents the bit width of the bit lines constituting a bit line group as well as the bit width of the data lines D1, D2 and D3. For example, 16 bit width (N=16) may be used.

In the first embodiment shown in FIG. 1, when rewriting the trimming information or write protection information stored in the non-volatile storage 11, the storage information read from each non-volatile memory cells MC to be rewritten is written in the volatile storage 25 through the verification operation performed after applying bias voltage during the rewriting operation. This eliminates reading data from the non-volatile storage 11 by a readout sense amplifier (not shown) after completion of rewriting when storing the operational information stored in the non-volatile storage 11 in the volatile storage 25. As a result, the readout time can be reduced.

Storing data in the volatile storage 25 can be repeated more than once in response to the verify instruction signal PGV/ERV being repeated more than once. Alternatively, the readout data, when completion of the rewriting operation is confirmed, can be stored in response with the match signal MCH obtained by a comparison with the expected data. In the latter case, there is no need to store the storage information before rewriting. This reduces unnecessary circuit operation, leading to a reduction in current consumption.

Figure 2:
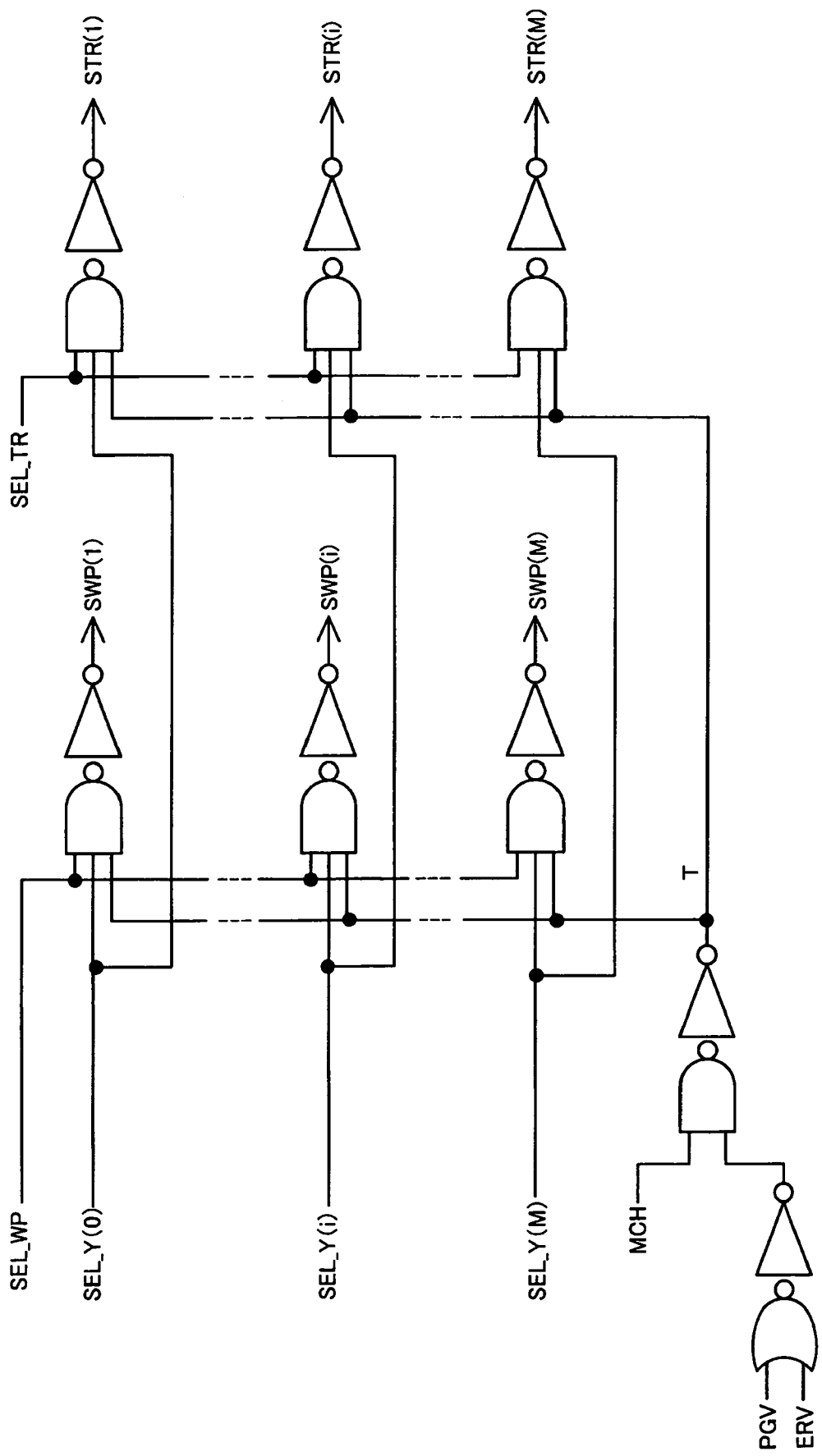
FIG. 2 shows a first illustrative example of a selector according to the first embodiment.
Figure 3:
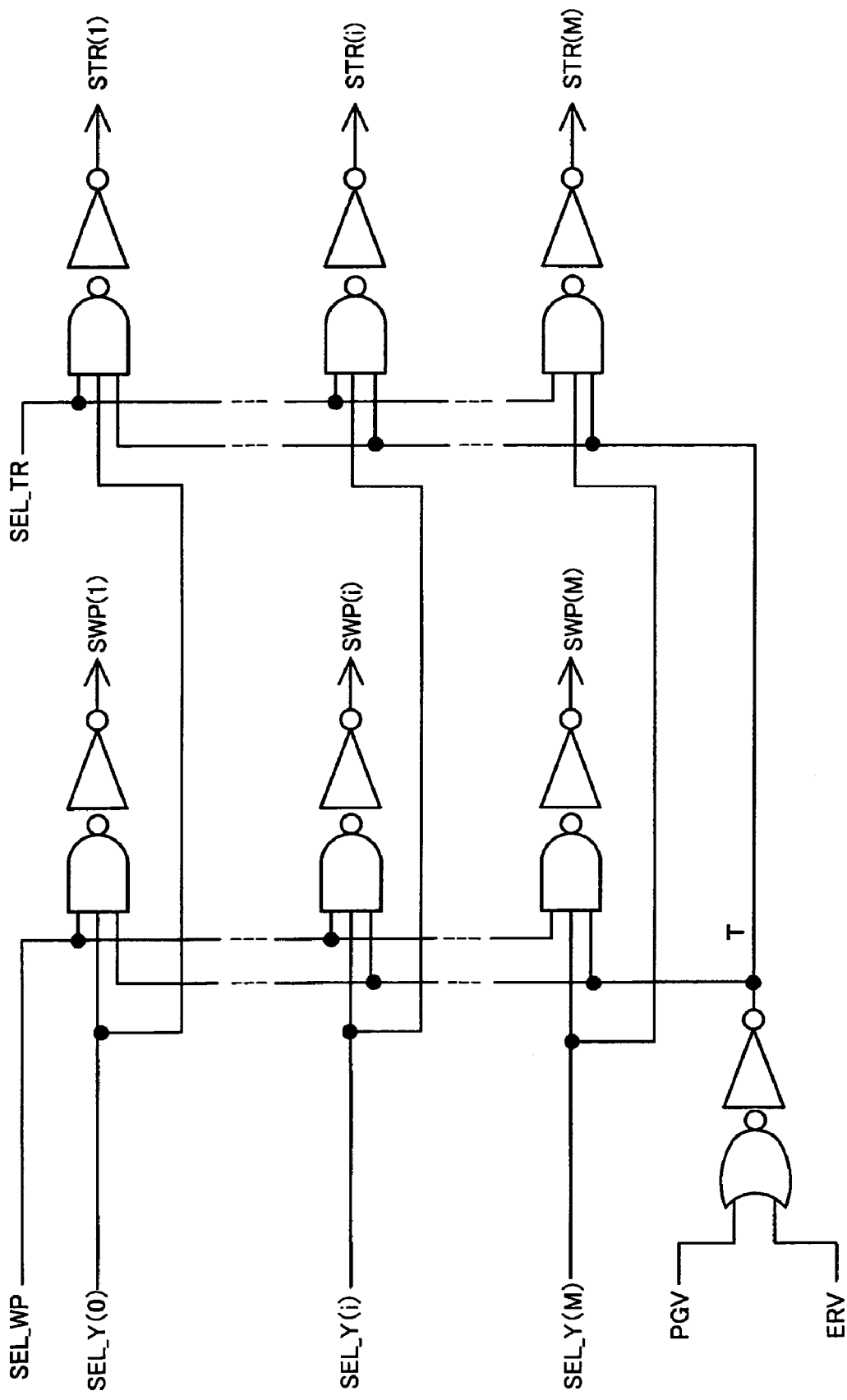
FIG. 3 shows a second illustrative example of the selector of the first embodiment.

FIGS. 2 and 3 show illustrative examples of the selector 23. The selection signal SEL_TR or SEL_WP and the Y decode signal SELY(i) (i=1 to M) are input to NAND gates in combination. Commonly input to the NAND gates is an output timing signal T. With the timing at which the output timing signal T is activated, going to a high level, any one of the decode signals STR(i)/SWP (i) selected by the selection signal SEL_TR or SEL_WP and the Y decode signal SEL_Y(i) is so activated as to go to a high level and is output.

In the case of FIG. 2, the verify instruction signal PGV/ERV is subjected to logic operation OR through a NOR gate and an inverter gate and input to a NAND gate together with the match signal MCH, so that the output timing signal T is output through the inverter gate as a signal which has undergone the logic operation OR. With the timing of outputting an instruction of verification operation irrespective of the programming operation or erasing operation, the output timing signal T is output indicating that the rewriting operation has been completed. The readout data, about which completion of the rewriting operation has been confirmed, is stored in the volatile storage 25 as it is. With the timing of the completion of the rewriting, the output timing signal T is output only once and the storing of the data is performed.

In the case of FIG. 3, the output timing signal T is output as a signal resulting from the logic operation OR of the verify instruction signal PGV/ERV through the NOR gate and the inverter gate. Whenever an instruction of the verification operation has been output irrespective of the programming operation or erasing operation, the output timing signal T is output. For every bias voltage application, the readout data about which the status of rewriting has been confirmed is stored in the volatile storage 25. At the time of completing the rewriting, storing of the rewritten data is performed.

Figure 4:
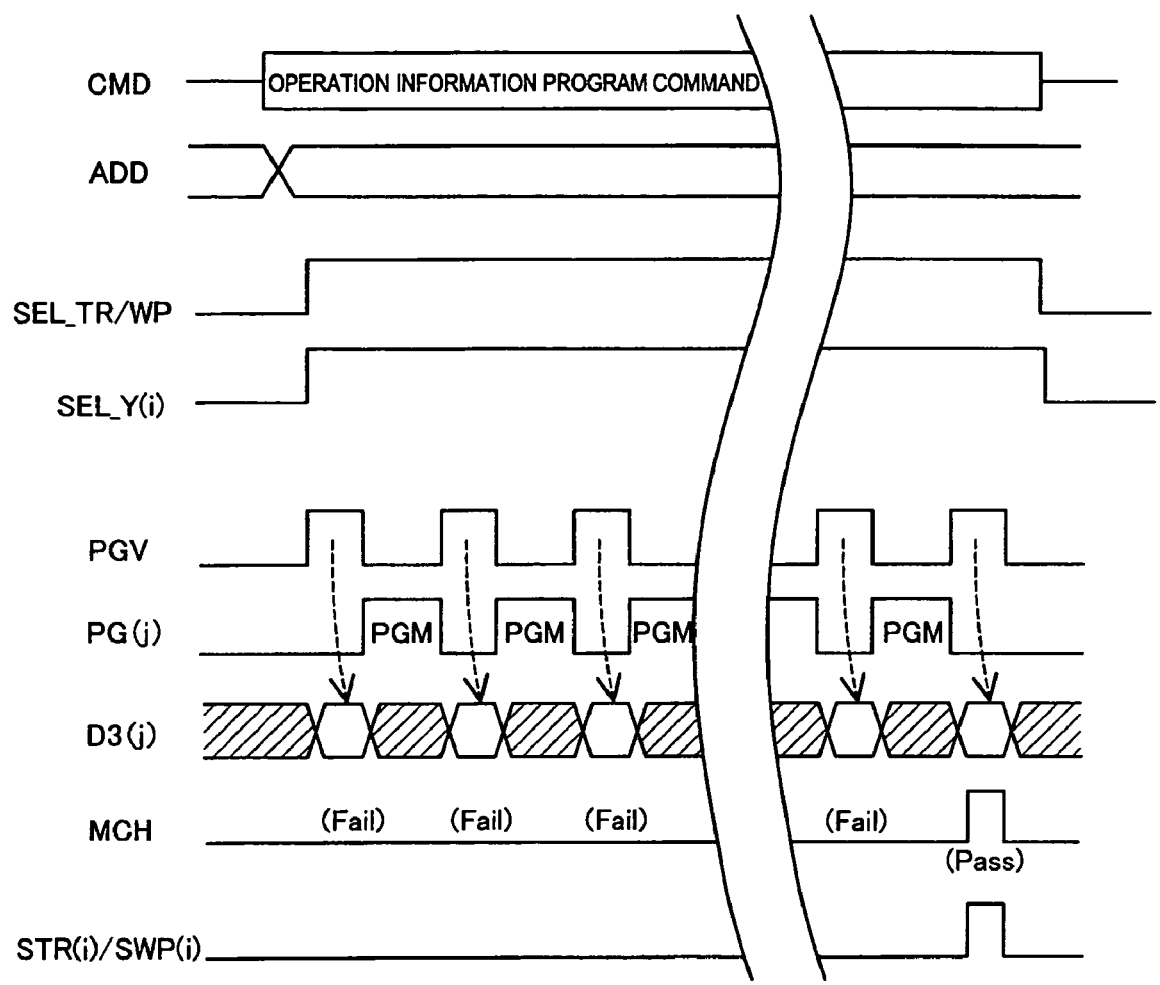
FIG. 4 is a timing chart of a program operation according to the first embodiment.

FIG. 4 shows a timing chart of the program operation for operational information. More particularly, FIG. 4 shows a timing chart for a case where the selector 23 has the configuration shown in FIG. 2. A program command for setting operational information such as the trimming information for adjustment of operating conditions and the write protection information is input together with address information ADD (in cases where the operational information to be set is the write protection information, the address information ADD is indicative of sectors in which write protection is to be activated). In response to the program command, the selection signal SEL_TR or SEL_WP and the Y decode signal SEL_Y(i) (i=1 to M) are output according to the operational information.

Preceding the program operation, data on the non-volatile memory cells MC, which have been selected by the selection signals SEL_TR, SEL_WP and connected to the bit line group BL(i) (i=1 to M) selected by the Y decode signal SEL_Y(i) (i=1 to M), are read out by the verify sense amplifier 19 when the verify instruction signal PGV goes to the high level. Each readout data item is compared to the expected data in the comparator circuit 21 and then a check on a bit-by-bit basis is made to determine whether each non-volatile memory cell MC is in a programmed state.

As a result of the determination, the program operation is performed on the non-volatile memory cells MC which are not in the programmed state. The bit line to which each non-volatile memory cell MC is connected is only one of the N number of bit lines within the bit line group BL(i). This bit line is selected by the program instruction signal PG(j) (j=1 to N) and a bias voltage for programming is applied to it. After application of the bias voltage, data is read from the non-volatile memory cell MC by the high-level verify instruction signal PGV and then compared to the expected data. Until matching is judged as the result of the comparison, bias application and data comparison are alternately and repeatedly carried out. While the data stored in the non-volatile memory cells MC which are candidates for the program operation being compared to the expected data, bias application and the program operation are sequentially performed. At the time when the readout data matches the expected data, it is determined that the program operation has been completed and the high-level match signal MCH is output. In response to the match signal MCH, the decode signal STR(i)/SWP(i) goes to a high level to be output. The readout data when the match signal MCH was output is stored in the volatile storage 25 selected by the decode signal STR(i)/SWP(i).

Although the timing chart of the selector 23 having the configuration shown in FIG. 3 is not shown in the drawings, the Y decode signal SEL_Y(i) (i=1 to M) and the decode signal STR(i)/SWP(i) selected by the selection signal SEL_TR/SEL_WP go to the high level to be output in response to each time at which the verify instruction signal PGV goes to the high level. In every verification operation after application of the bias voltage, the decode signal STR(i)/SWP(i) is output and the readout data is stored in the volatile storage 25.

Although a timing chart for the erasing operation relating to operational information is not shown in the drawings, the erasing operation is performed similarly to the timing chart of the program operation except that all the non-volatile memory cells MC of the non-volatile storage 11 are erased together and the bias voltage for erasing is different from the bias voltage for programming. More specifically, while the Y decode signal SEL_Y(i) (i=1 to M) is continuously incremented, the erasing operation is performed on the non-volatile memory cells MC connected to the bit line group BL(i) selected by each Y decode signal SEL_Y(i). Similarly to FIG. 4, application of a bias voltage for erasure responsive to the erase instruction signal ER and the subsequent verification operation responsive to the verify instruction signal ERV are repeatedly performed. When the readout data matches the expected data, the erasing operation is determined to be finished so that the match signal MCH at the high level is output. In response to the output of the match signal MCH, the Y decode signal SEL_Y(i) and the decode signal STR(i)/SWP(i) selected by the selection signal SEL_TR/SEL_WP going to the high level are output. The readout data when the match signal MCH is output is stored in the volatile storage 25 selected by the decode signal STR(i)/SWP(i).

Like the program operation, it is feasible for the erase operation to output the decode signal STR(i)/SWP(i) and store the readout data in the volatile storage 25 each time the verification operation is performed subsequent to application of the bias voltage.

If the data stored in the non-volatile memory cells MC is not reversed in the course of rewriting, previous data will be read out. In a state where rewriting has not been completed, it is preferable that the non-volatile storage operate based on the operational information before alteration and the volatile storage also continue to store the previous operational information. Even if the data read out by the verification operation is stored in the volatile storage while writing is not finished, the memory contents will remain unchanged and the set operational information will not be altered.

An initial setting of operational information is transferred from the non-volatile storage to the volatile storage and stored therein, in response to turning ON of the power source. Reference is made to FIGS. 9 to 15 to describe, in further detail, the embodiment of FIG. 1 including this function.

Figure 9:
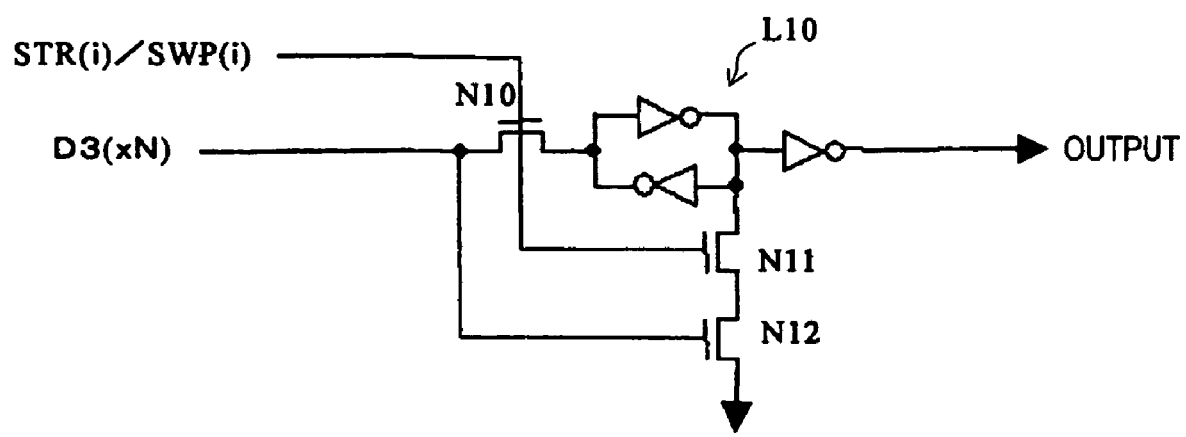
FIG. 9 is a detailed circuit diagram of volatile storage 25 according to the first embodiment.

FIG. 9 is a detailed diagram of the circuit of the volatile storage 25 shown in FIG. 1. As discussed later with reference to FIG. 10, the volatile storage 25 is such that the data read from a non-volatile memory cell MC and sent to the verify sense amplifier 19 through the data line D3 is stored in a storage area selected in the way described in a third illustrative example of the selector 23 shown in FIG. 1. Referring to FIG. 9, in the selected volatile storage, transistors N10 and N11 become electrically conductive and the information on the data line D3 is transferred to a latching circuit L10 and retained according to the decode signal STR(i)/SWP(i) indicative of the storage position in the non-volatile storage. A transistor N12 is a compensation element for the N-channel transistor N10 and compensates for a drop in the output voltage of the transistor N10 from the threshold voltage when the information on the data line D3 is "1", so that the inversion of the latching circuit L10 is speeded up. Where a P-channel transistor is arranged in parallel with N11, N12 becomes unnecessary.

Figure 10:
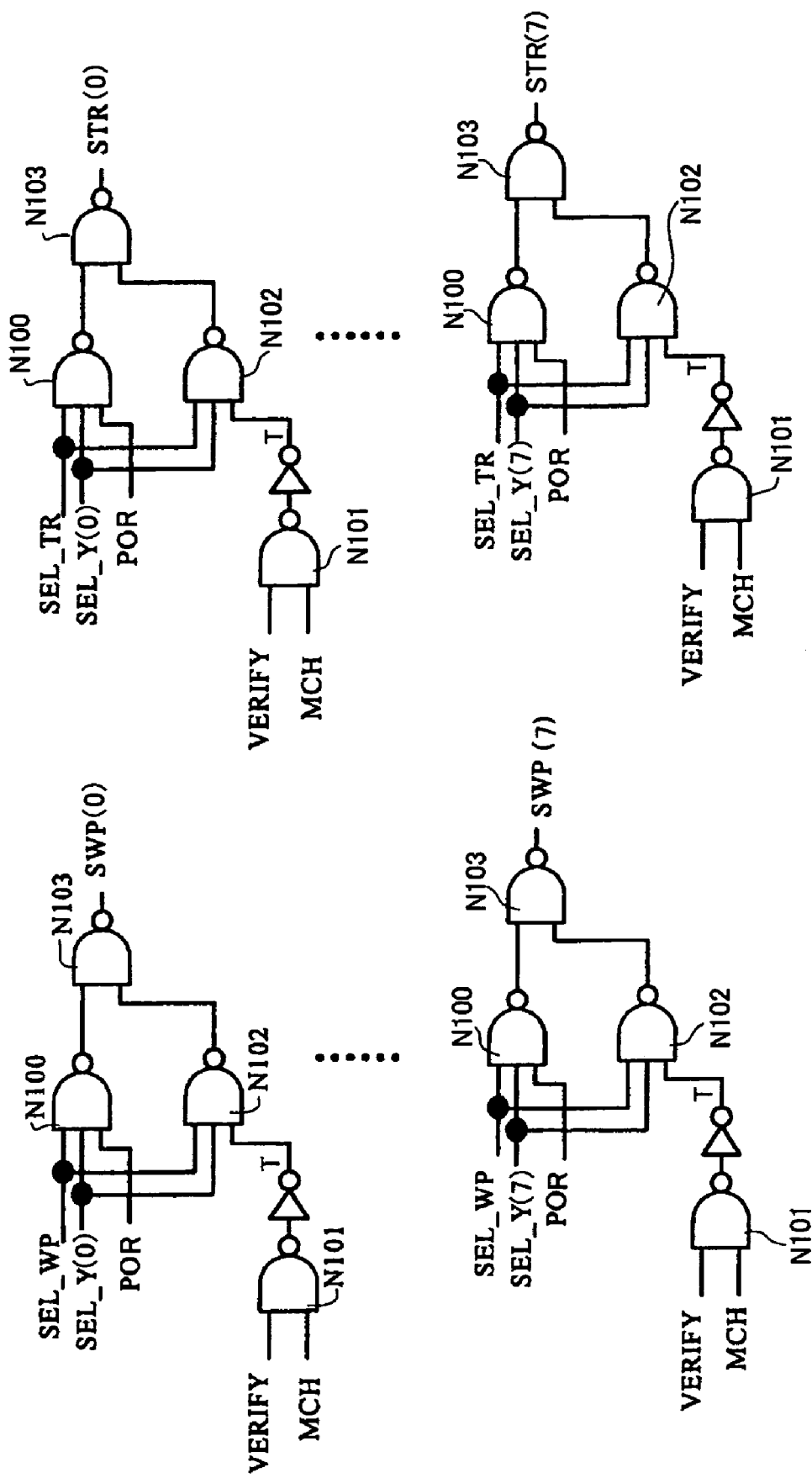
FIG. 10 shows a third illustrative example of the selector of the first embodiment.

FIG. 10 shows the third illustrative example of the selector 23 shown in FIG. 1, in which M=8. This example is associated with a selector circuit for selecting the volatile storage shown in FIG. 9. Only the portions of FIG. 10 different from FIG. 2 will be explained. In FIG. 10, the selector 23 is equipped with a logical gate N100 to which a power-ON detection signal POR is input. In response to turning ON the power source, the power-ON detection signal POR is activated and operational information items are sequentially transferred from the non-volatile storage to the volatile storage, stored in the volatile storage locations sequentially selected by the selection signal SEL_TR/SEL_WP and the Y decode signal SEL_Y(i).

That is, initialization of the operational information after turning ON of the power source is done through the function of the selector which is put in operation by the logical gates N100, N103. When rewriting of the operational information is performed by the user, the logical gates N101, N102, N103 allow the selector to operate, similar to the operation described earlier in FIG. 2. Herein, the signal VERIFY shown in FIG. 10 is an output signal obtained by logic operation OR of the verify instruction signal PGV or ERV through the NOR gate and the inverter gate.

Figure 11:
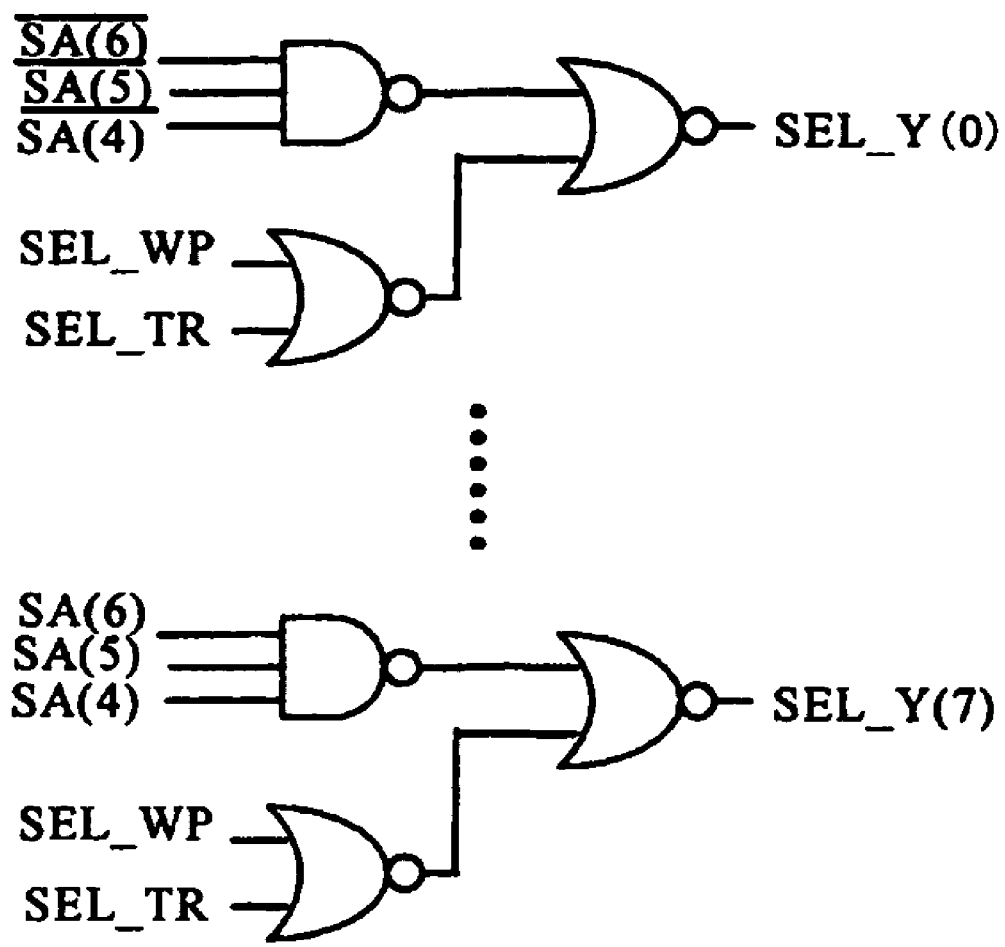
FIG. 11 shows a decode circuit of Y decode signal SEL-Y(i) (i=0 to 7).

As shown in FIG. 11, the Y decode signal SEL_Y(i) (i=0 to 7) is generated from the logical OR of the decode logical output (described later) of each of the sector addresses SA(0) to SA(6) and the selection signal SEL_TR/SEL_WP.

FIG. 12 is a look-up table of sector addresses, the second type of operational information, and the memory cells of the non-volatile storage. This table shows in which column addresses (SEL_Y(i) (i=0 to 7)) on the word line WLWP of the non-volatile storage and in which of I/Os (D2(0) to (15)) each of the sector addresses SA(0) to SA(6) and the protection information (i.e., the second type of operational information) indicative of each sector are stored. In this example, there are 128 sectors consisting of 0th to 127th sectors. For instance, when the sector 0 is to be programmed, the SEL_Y(0) is selected and programming is performed on only D2(0) out of the sixteen data buses.

FIG. 13 is a look-up table of sector addresses, the first type of operational information, and the memory cells of the non-volatile storage. This table shows in which of the column addresses on the word line WLTR of the non-volatile storage and in which of I/Os each of the sector addresses SA(0) to SA(6) and the trimming information (i.e., the first type of operational information) for each sector are stored. In this example, the trimming information has 128 bits consisting of 0th to 127th bits. In this case, these sector addresses are used for addressing when the trimming data is to be programmed. Rewriting of the first type of operational information or the second type of operational information is performed on the non-volatile storage. The first type of operational information or the second type of operational information is read from the non-volatile storage and stored in the volatile storage when the power source is turned ON. Therefore, the circuit operated by use of the protection information or the trimming information does not directly read the operational information from the non-volatile storage as circumstances demand, but operates by looking up the operational information retained by the volatile storage. How the circuit operates is shown in FIG. 14.

Figure 14:
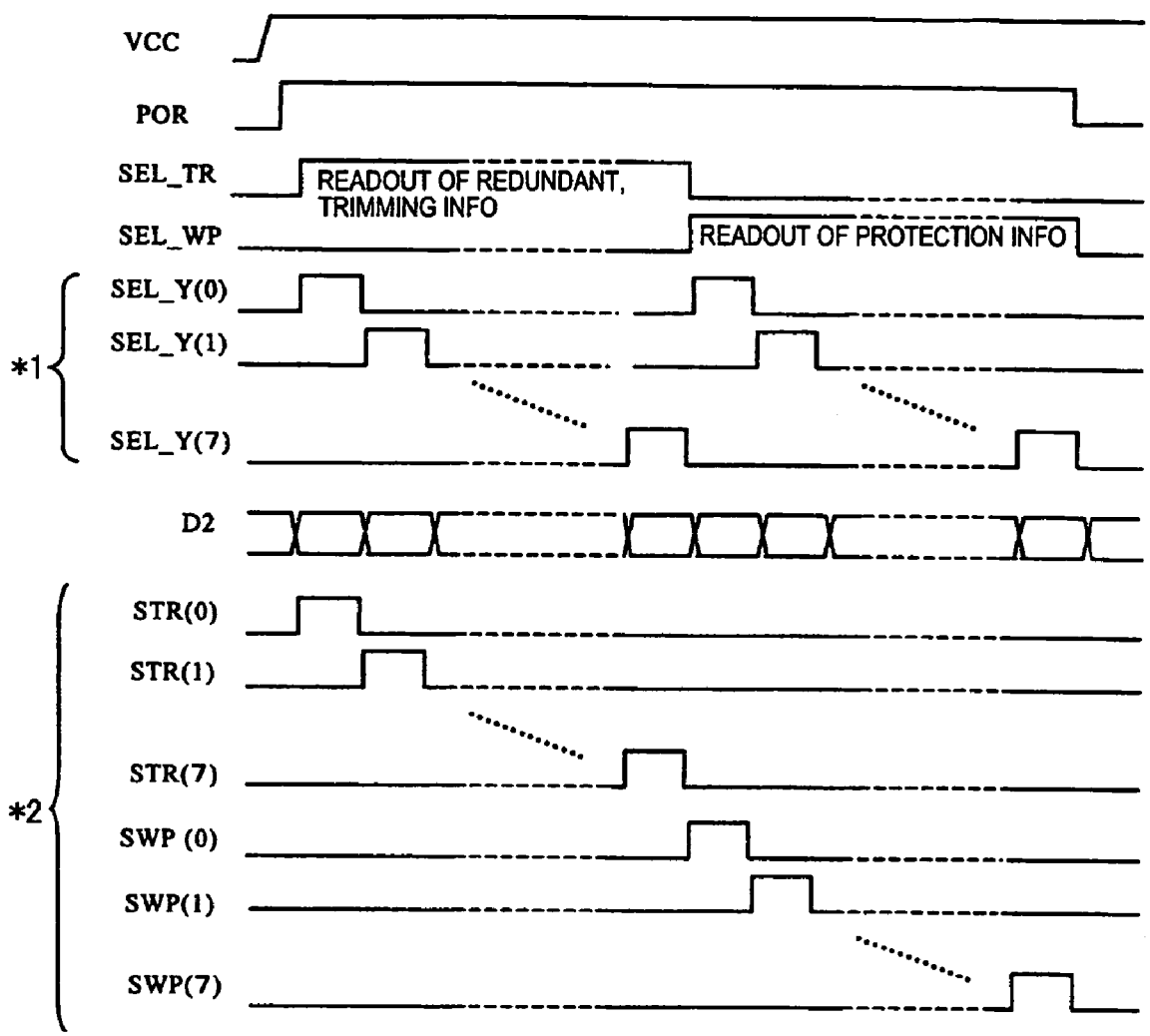
FIG. 14 is a timing chart showing an operation of reading out the first type operational information and the second type operational information after turning ON a power source according to the first embodiment.

FIG. 14 is a timing chart of an operation for reading out the first or second type operational information after turning ON of the power source in accordance with the first embodiment. The power-ON detection signal POR is a signal which goes to the high level, when the information stored in the non-volatile storage is read out and stored in the volatile storage while the power source of the device is turned ON to start the device. In this example, SEL_TR becomes high immediately after start-up; SE_Y(i) (i=0 to 7) are sequentially selected; and the redundant address information and trimming information are read from the non-volatile storage and stored in the volatile storage. Then, SEL_WP becomes high so that the protection information is read from the non-volatile storage and stored in the volatile storage.

Sector protection information stored in the volatile storage is constantly output to signal lines WP(0) to WP(127), and the redundant address information and trimming information is constantly output to signal lines TR(0) to TR(127). The circuits operated in response to the above information may perform operations by constantly looking up these signals. For instance, when programming or erasing the sector 0, the operational information of WP(0) is first looked up. If protected, control is performed so as to inhibit programming or erasing. If the trimming information for an oscillator cycle is allocated to TR(0) to TR(2), the cycle is changed according to the condition of TR(0) to TR(2).

Figure 15:
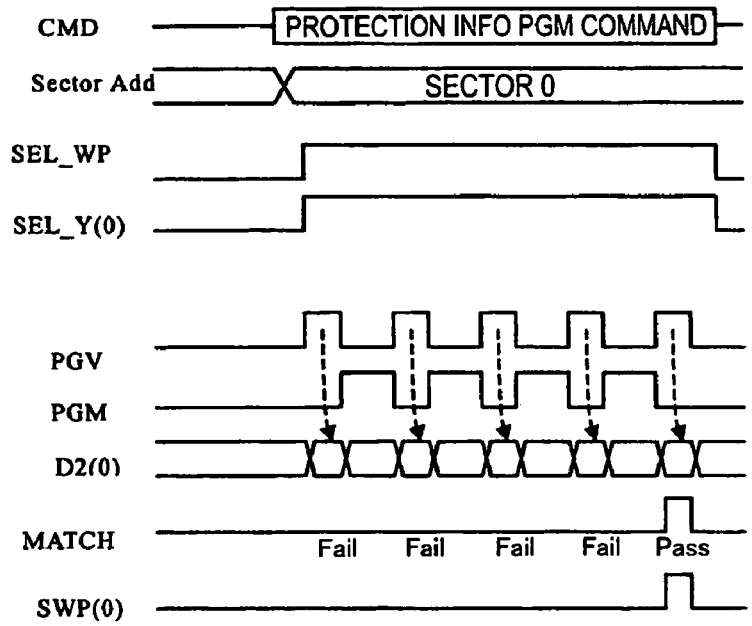
FIG. 15 is a timing chart showing an operation of programming the operational information of a sector 0 according to the first embodiment.

FIG. 15 shows, by way of example, the waveform of the program operation performed on the operational information of sector 0 in accordance with the first embodiment. This operation is for changing the data of the non-volatile memory cell from "1" to "0", the non-volatile memory cell storing the operational information corresponding to the sector 0 of the non-volatile storage. In this case, since the program operation needs to be retained even when the power source is shut off, the program operation is performed on the previously allocated address of the non-volatile storage. In the case of the sector 0, SEL_Y(0) is selected and the program operation is performed on the I/O which is connected to D2(0) among 16 bit lines connected to the word line WLWP selected by SEL_WP. Then, the verification operation is performed for verifying whether or not programming has been finished, by actually reading data from the non-volatile storage. The above program operation is repeated until verification is passed. If verification is passed, since the readout data at that time has already been output onto the data bus D3 by a verify amplifier, the contents of the rewritten non-volatile storage can be stored in the volatile storage so that the rewritten operational information can be immediately ready for use, by making SWP(0) high and storing the data in the volatile memory. The redundancy information and trimming information are programmed in the same way.

Figure 16:
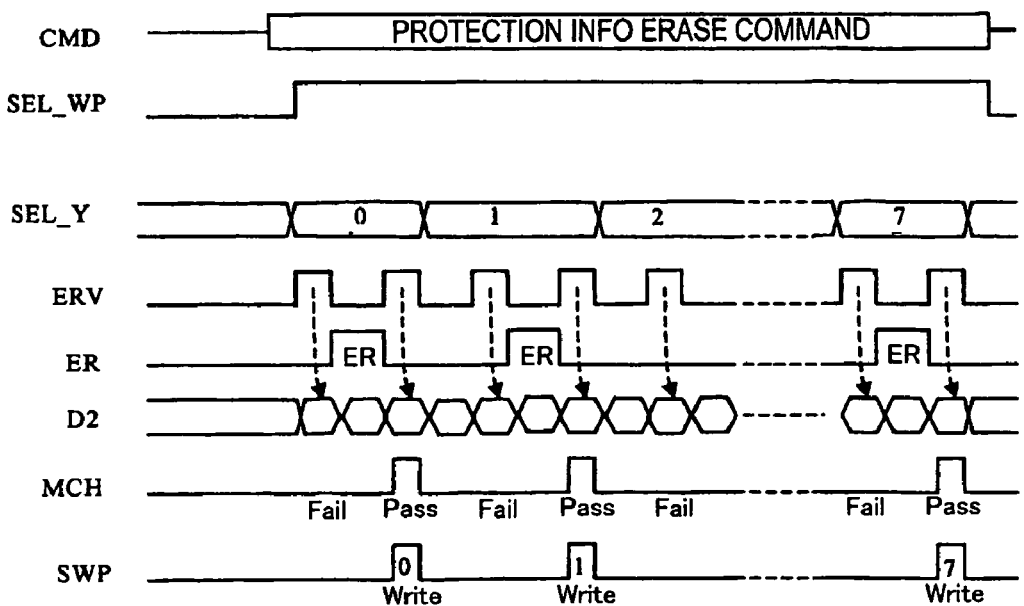
FIG. 16 is a timing chart showing an operation of erasing the operational information of sectors according to the first embodiment.

FIG. 16 shows the waveform of the erasing operation performed on the operational information of sectors in accordance with the first embodiment. Unlike the program operation described earlier, the erasing operation is batch processing, that is, the operational information of all sectors is erased at one time. More specifically, data stored in the 128 non-volatile memory cells for storing operational information, which memory cells correspond to the sectors of the non-volatile storage, are changed from "0" to "1" simultaneously. Therefore, the verification operation is also performed on the operational information of all the sectors which have undergone the erasing operation. Similar to the program operation, it is verified whether or not erasure has been completed, by actually reading data from the non-volatile storage, and the erasing operation is repeated until verification is passed. If verification is passed, since the readout data at that time point has already been output onto the data bus D3 by the verify amplifier, the contents of the rewritten non-volatile storage can be stored in the volatile storage so that the rewritten operational information can be immediately accessible, by making SWP high and storing the data in the volatile storage. This erasing operation is performed on the protection information of all the sectors. The redundancy information and trimming information can be erased in the same manner.

Figure 5:
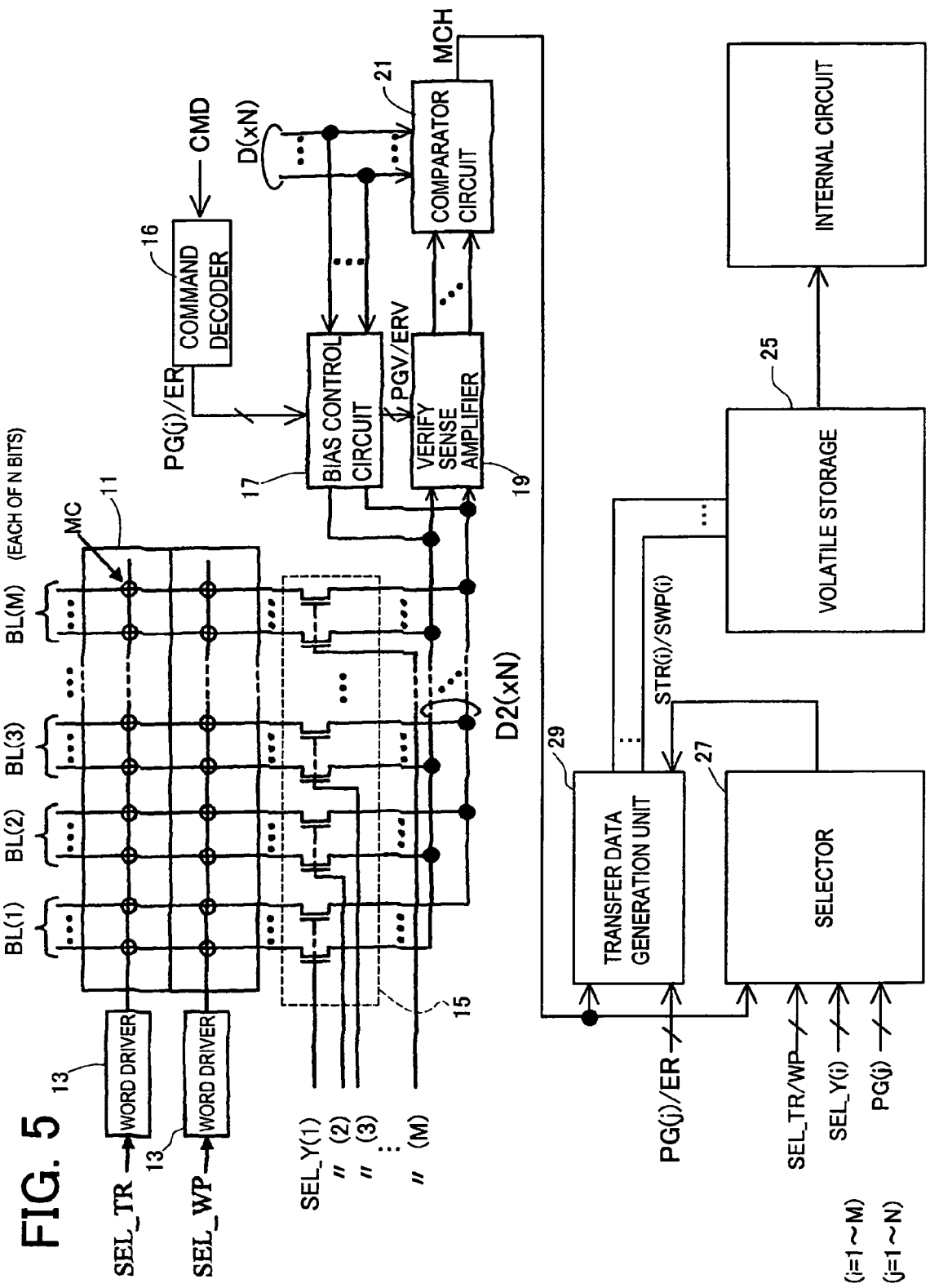
FIG. 5 is a circuit block diagram according to a second embodiment.

The second embodiment shown in FIG. 5 is associated with a case where the data determined according to a signal instructive of the rewriting operation is stored in the volatile storage upon completion of the rewriting operation, by utilizing the fact that the data after rewriting is determined in response to the type of rewriting operation performed on the non-volatile storage. More specifically, the direction of transition of rewriting data in a non-volatile memory is decided such that rewriting is done so as to change data from "1" to "0" in the case of the program operation and so as to change data from "0" to "1" in the case of the erasing operation. This feature of rewriting non-volatile memory cells is utilized. After a command signal CMD has been input to the command decoder 16 from outside, the command signal CMD is decoded and a program instruction signal PG(j) or an erase instruction signal ER is output. The program instruction signal PG(j) or the erase instruction signal ER is retained by the command decoder 16 as a logical signal corresponding to the operational information retained so as to be logically processable, and the inversion of the memory data of the volatile storage is controlled.

Referring to FIG. 5, the circuit block diagram of the second embodiment includes a selector 27 in place of the selector 23 shown in the circuit block diagram (FIG. 1) of the first embodiment and a transfer data generation unit 29.

Input to the selector 27 are the selection signal SEL_TR/SEL_WP, the Y decode signal SEL_Y(i) (i=1 to M), the program instruction signal PG(j) (j=1 to N) and the match signal MCH output from the comparator circuit 21. The decode signal STR(i)/SWP(i) indicative of the storage position of the volatile storage 25 is output for every non-volatile memory cell MC connected to the bit line group BL(i) of the non-volatile storage 11, the bit line group being selected by the selection signal SEL_TR/SEL_WP and the Y decode signal SEL_Y(i). In the case of the program operation, the bit line connected to the non-volatile memory cell MC to be programmed (the candidate for programming) is selected from the N number of bit lines included in the bit line group BL(i). In this case, the decode signal STR(i)/SWP(i) is output at the time when the match signal MCH goes to the high level. Upon completion of rewriting, the data storage position in the volatile storage 25 is indicated.

In the transfer data generation unit 29, the match signal MCH and the program instruction signal PG(j) (j=1 to N) or the erase instruction signal ER are input. In concert with outputting of the match signal MCH, the data corresponding to the N number of bit lines constituting the bit line group BL(i) are output. The data in the programmed state is generated in correspondence with the bit lines connected to the non-volatile memory cells MC to be rewritten among the N number of bit lines. In the case of the erasing operation, data in an erased state is generated in correspondence with all the bit lines constituting the bit line group BL(i).

This enables the selector 27 to output the decode signal STR(i)/SWP(i) corresponding to the candidate for rewriting in response to outputting of the match signal MCH indicative of completion of the rewriting operation, and enables the transfer data generation unit 29 to output data corresponding to the rewriting operation in response to the bit position of the candidate for rewriting.

Figure 6:
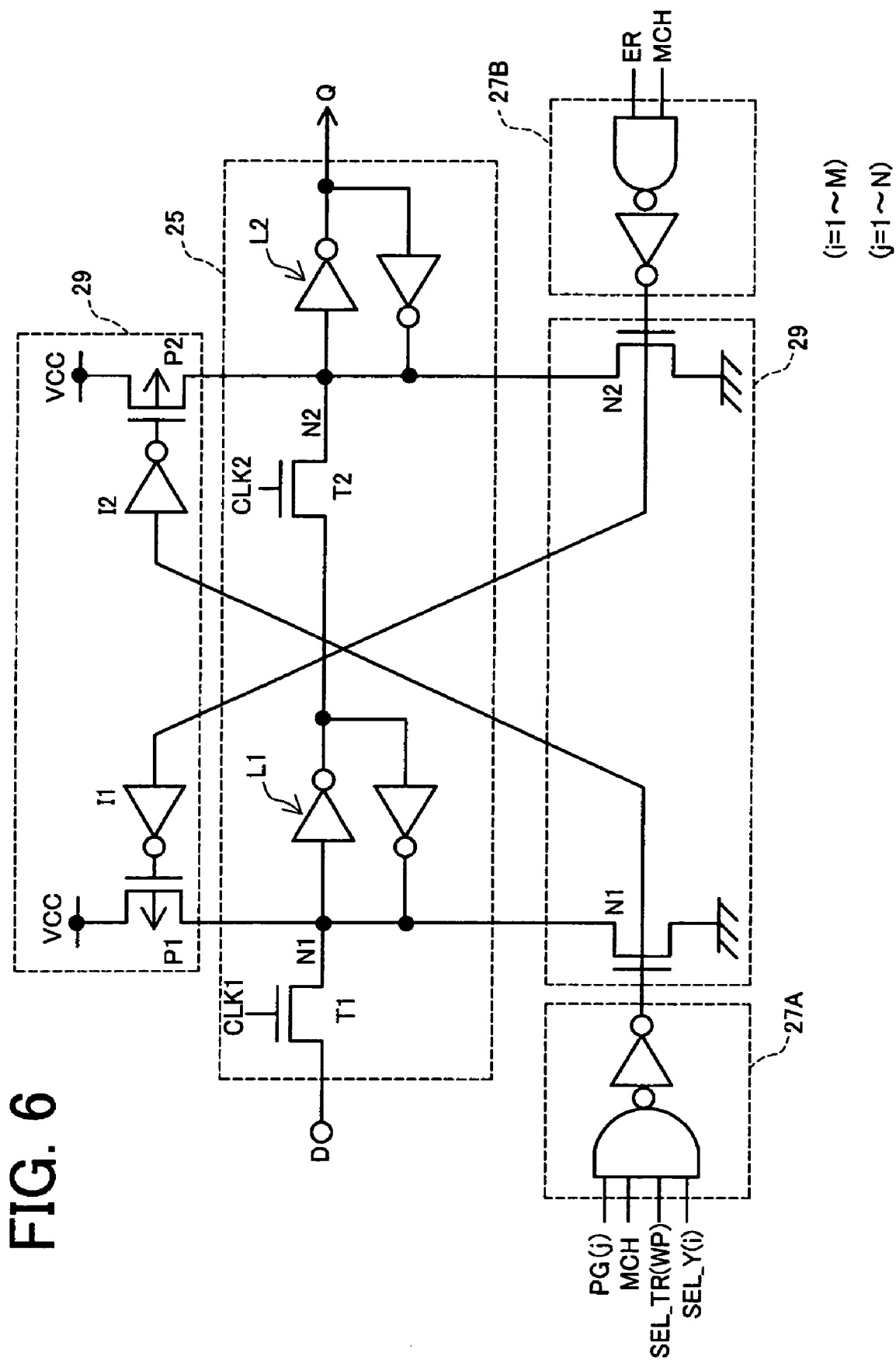
FIG. 6 is a circuit diagram showing volatile storage according to the second embodiment and performance of writing control for the volatile storage.
Figure 7:
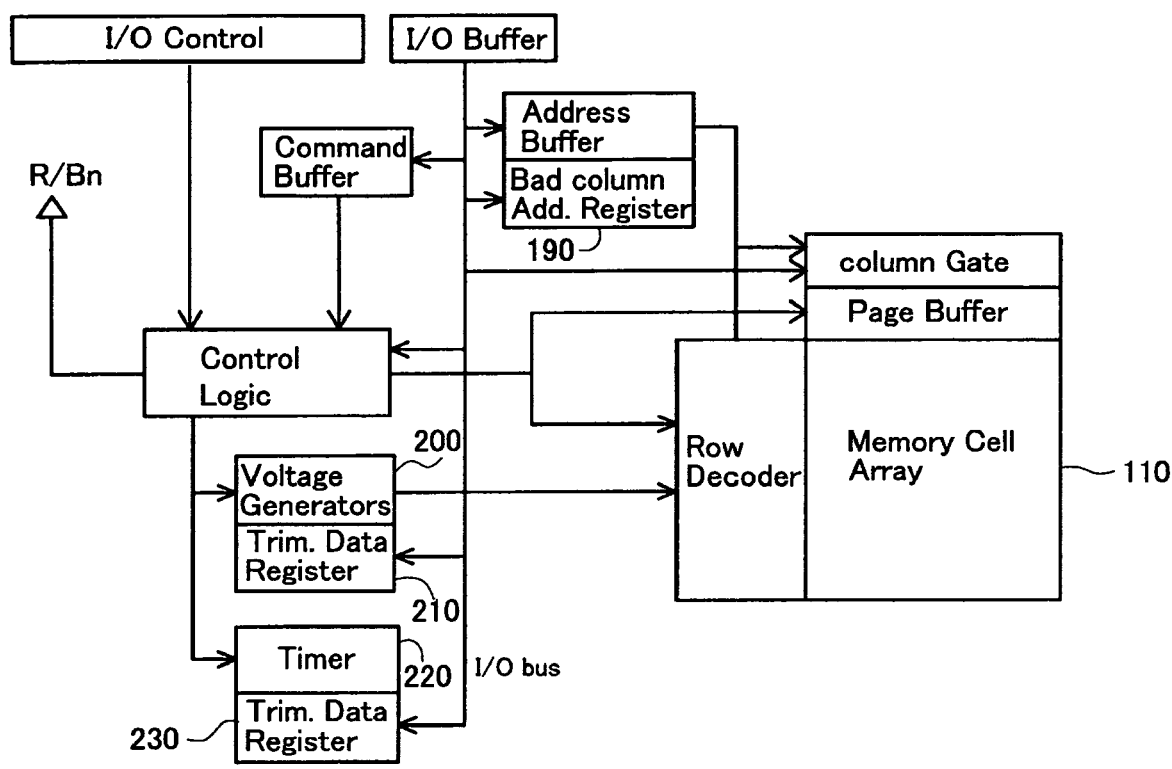
FIG. 7 is a circuit block diagram of a semiconductor device according to Patent Document 1.
Figure 8:
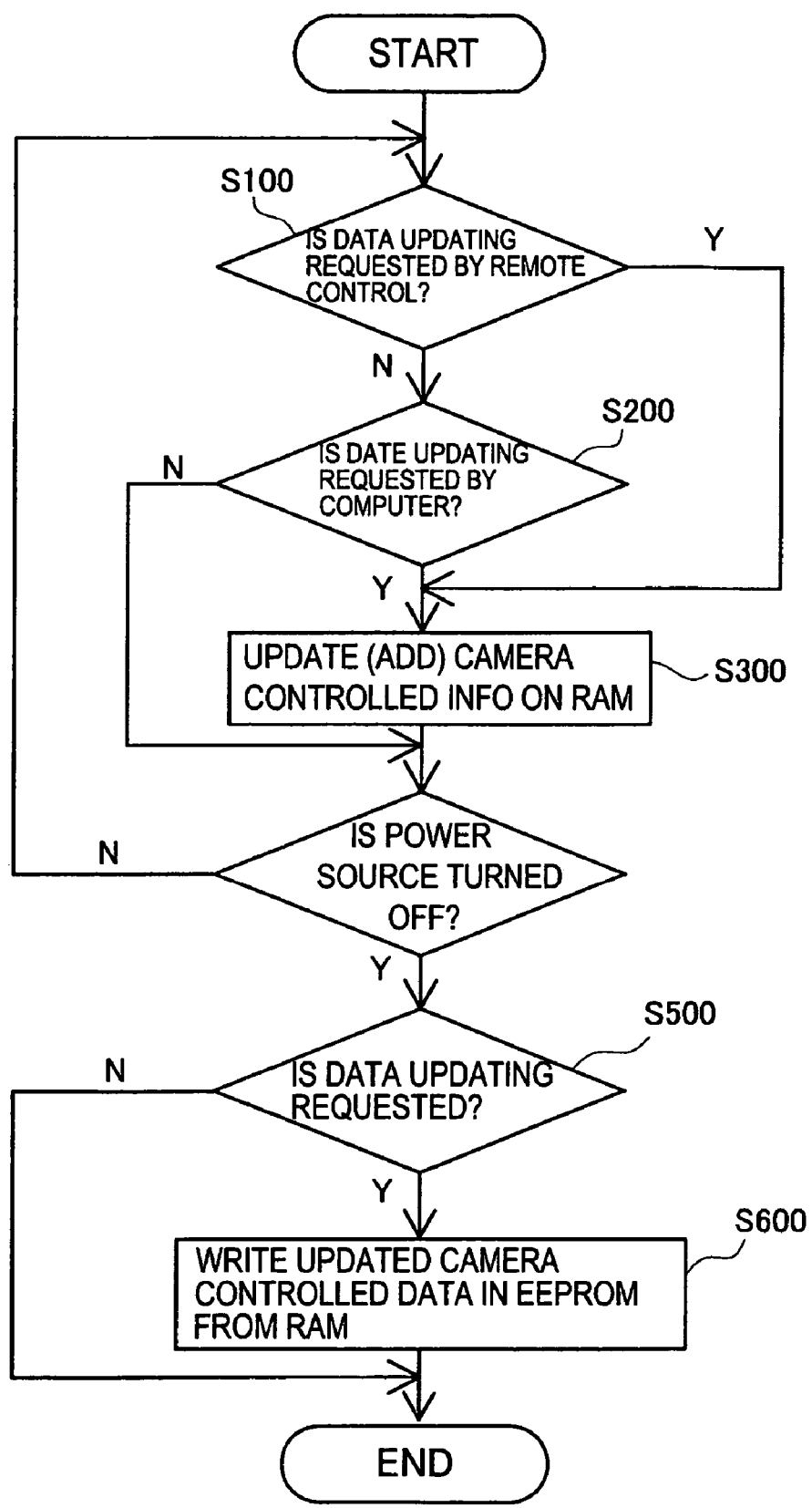
FIG. 8 is an operational flow chart of Patent Document 2.

FIG. 6 shows a circuit example embodying the volatile storage 25, the selector 27 and the transfer data generation unit 29. This diagram shows circuit configuration for storing one bit data.

The volatile storage 25 has a shift register configuration in which two latching circuits L1, L2 are connected through the transfer gate T2. The input terminal D is connected to the latching circuit L1 through the transfer gate T1, whereas the latching circuit L2 is connected to an output terminal Q. Although not shown in the drawings, the volatile storage 25 is formed such that the output terminal Q of every volatile storage is connected to the input terminal D of the next volatile storage 25, thereby forming a multiple-stage, series-connected configuration in which sequential data transfer can be performed, starting from the input terminal of the volatile storage 25 at the first stage. When the power source is turned ON, the operational information stored in the non-volatile storage 11 is read out by the input terminal D at the first stage and sequentially transferred to the volatile storage 25 to be stored therein.

In the latching circuit L1, a PMOS transistor P1 is connected between a storage node N1 and a power source voltage VCC, and an NMOS transistor N1 is connected between the storage node N1 and the ground potential. In the latching circuit L2, a PMOS transistor P2 is connected between a storage node N2 and a power source voltage VCC and an NMOS transistor N2 is connected between the storage node N2 and the ground potential. An inverter gate 11 is connected from the gate terminal of the NMOS transistor N2 to the gate terminal of the PMOS transistor P1. An inverter gate 12 is connected from the gate terminal of the NMOS transistor N1 to the gate terminal of the PMOS transistor P2. The PMOS transistors P1, P2, the NMOS transistors N1, N2 and the inverter gates 11, 12 constitute the transfer data generation unit 29.

The selector 27 is composed of a decode unit for programming 27A for driving the NMOS transistor N1 and the inverter gate 12, and a decode unit for erasure 27B for driving the NMOS transistor N2 and the inverter gate 11. In the former one, i.e., the decode unit for programming 27A, one of the program instruction signals PG(j) (j=1 to N), the match signal MCH, the selection signal SEL_TR or SEL_WP, and one of the Y decode signals SEL_Y(i) (i=1 to M) are input to the NAND gate. A decoded signal is output from the NAND gate through the inverter gate. In the latter one, i.e., the decode unit for erasure 27B, the erase instruction signal ER and the match signal MCH are input to the NAND gate from which a decoded signal is output through the inverter gate.

In the decode unit for programming 27A, any one bit line group BL(i) (i=1 to M) is selected according to the Y decode signal SEL_Y(i) and the row-directional positions of the non-volatile memory cells MC connected to the selected bit line group BL(i) are determined in accordance with the selection signal SEL_TR or SEL_WP. Further, in response to the program instruction signal PG(j), the non-volatile memory cell MC to be programmed is determined, being selected from the selected non-volatile memory cells MC. The non-volatile memory cells MC arranged in the non-volatile storage 11 each have the volatile storage 25. Among the decode units for programming 27A which are respectively provided for the volatile storages 25, one decode unit for programming 27A is activated and allowed to output a high level signal in accordance with the above combination of signals, subsequently to the output of the high-level match signal MCH, so that the NMOS transistor N1 and the PMOS transistor P2 become electrically conductive. Low level and high level signals are stored in the storage node N1 and the storage node N2, respectively. The output terminal Q of the volatile storage 25 is kept low so as to output a low level signal and the data "0" indicative of the programmed state is output.

In the decode unit for erasure 27B, all the non-volatile memory cells MC arranged in the non-volatile storage 11 are erased simultaneously. Therefore, the associated volatile storages 25 need to store the data "1" indicative of a batch erase condition, irrespective of the Y decode signal SEL_Y (i) and the selection signals SEL_TR, SEL_WP. All of the decode units for erasure 27B respectively provided for the volatile storages 25 are activated so as to output a high level signal, following the output of the high-level match signal MCH, so that the NMOS transistor N2 and the PMOS transistor P1 become electrically conductive. High level and low level signals are stored in the storage node N1 and the storage node N2, respectively. All the output terminals Q of the volatile storages 25 are kept high so as to output a high level signal and the data "1" indicative of an erased state is output.

Herein, the verify sense amplifier 19 is one example of the discrimination unit and amplifier, and the readout data amplified by and output from the verify sense amplifier 19 is one example of the logical signal corresponding to the operational information retained so as to be logically processable. The command decoder 16 is another example of the discrimination unit and rewriting control unit, and the program instruction signal PG(j) and erase instruction signal ER which are output from the command decoder 16 are examples of the logical signal corresponding to the operational information retained so as to be logically processable. The comparator circuit 21 is an example of a matching judgment unit or a completion judgment unit. The transfer data generation unit 29 is one example of a rewriting information instruction unit.

If the data stored in the non-volatile memory cell MC is not reversed in the course of rewriting, the operational information stored in the volatile storage by the match signal MCH indicative of completion of the rewriting operation remains previous data. In the state where rewriting is not completed, it is advisable that the non-volatile storage operate according to the operational information before alteration.

As clear from the foregoing description, in the present embodiment, when operational information such as the trimming information or the write protection information is set after turning ON of the power source or updated during a power supply period, the operation for storing data in the non-volatile storage 11 occurs. In the first embodiment, the data read from the rewritten non-volatile memory cell MC has already been sent to the verify sense amplifier 19 before completion of the data storage, so that the readout data can be transferred to the volatile storage 25 in response to the output of the match signal MCH indicative of completion of rewriting. According to the second embodiment, rewriting is the program operation or the erasing operation, and the logical values of the rewritten data are known beforehand. More specifically, upon completion of the program operation, the rewritten data becomes "0" and upon completion of the erasing operation, the rewritten data becomes "1". Therefore, the logical value of data after rewriting can be determined according to the program instruction signal PG(j) (j=1 to N) or the erase instruction signal ER, so that the determined data can be stored in the volatile storage 25 beforehand in response to output of the match signal MCH indicative of completion of rewriting.

The readout access operation for reading operational information from the non-volatile storage 11 is affected only when the power source is turned ON or when reset operation is performed for initializing the non-volatile storage. If updating of operational information is affected during a power supply period, storing of operational information in the volatile storage 25 can be performed without rereading the data stored in the non-volatile storage 11. Thus, re-readout of operational information from the non-volatile storage 11 becomes unnecessary, which leads to a reduction in the time required for updating operational information. Further, the time taken for storing redundant address information and various kinds of trimming information at the time of delivery inspection of the non-volatile memory and, in consequence, the time required for delivery inspection can be reduced. After installation in an application system, settings of operational information such as write protection information may be altered at a request from the system, and in this situation, the updating time can be reduced.

It is conceivable with the progress of large-capacity, high-performance non-volatile memories that the number of defective memory cells which require the redundancy remedy scheme increases and the number of divisions (e.g., sectors) in the memory area to which the write protection function is applied increases. It is also conceivable that the number of circuit functions which require adjustment of operating conditions increases. In addition, it is conceivable that the number of operational information items such as redundant address information, write protection information, and various kinds of trimming information which have to be stored in the non-volatile storage increases. In this case, provision of the operational information storing function in accordance with the present embodiment makes it possible to quickly perform setting or updating of the operational information.

If operational information which determines the operating condition of the circuit is altered during a power supply period, the contents of the volatile storage 25 can be updated and the updated data can reflect on the circuit operation without delay, upon completion of storing of data in the non-volatile storage 11. Since it is unnecessary to perform the readout access operation after storing operational information in the non-volatile storage 11, there is no power consumption associated with the readout access operation.

Further, current consumption can be reduced in setting and updating operational information.

It is apparent that the invention is not necessarily limited to the particular embodiments shown herein and various changes and modifications may be made to the disclosed embodiments without departing from the spirit and scope of the invention.

While the invention has been discussed taking a case for example in which trimming information or write protection information is first stored in the non-volatile storage and then stored in the volatile storage, the invention is not limited to this. The invention is also applicable to other types of operational information such as redundant address information.

Examples of the second type of operational information may include read protection information, readout restriction information, or designation codes for giving readout permission.

What is claimed is:

1. A method of setting information of non-volatile memory that comprises non-volatile storage in which operational information is written down and volatile storage in which the operational information stored in the non-volatile storage is stored while power is supplied, the method of setting information of the non-volatile memory comprising the steps of:
    rewriting the non-volatile storage when the operational information is set or updated; and
    storing the operational information in the volatile storage based on a logical signal corresponding to the operational information that is retained so that a logical process can be executed, when the step of rewriting ends.

2. The method of setting the information of the non-volatile memory according to claim 1 wherein the step of rewriting has the steps of:
    applying bias to the non-volatile storage; and
    reading out stored information that is the stored information in the non-volatile storage and that is being rewritten by the step of applying bias,
    wherein the logical signal corresponding to the operational information is the stored information, and the volatile storage stores the stored information.

3. The method of setting the information of the non-volatile memory according to claim 2 wherein the steps of applying bias and reading out are alternately and repeatedly executed until the operational information is written down in the non-volatile storage, and wherein the step of storing the stored information in the volatile storage comprises the step of storing the stored information in the volatile storage every time the step of reading out is executed.

4. The method of setting the information of the non-volatile memory according to claim 2, having a step of determining a match between the stored information to be read by the step of reading out and the operational information, and
    wherein the stored information is stored in the volatile storage based on the step of determining a match.

5. The method of setting the information of the non-volatile memory according to claim 1, wherein the step of rewriting the non-volatile storage comprises rewriting the non-volatile storage according to a rewrite instruction signal when the operational information is set or updated,
    the method further comprising the step of determining whether the step of rewriting has been completed, and wherein the logical signal corresponding to the operational information is the rewrite instruction signal.

6. The method of setting the information of the non-volatile memory according to claim 5 further comprising a step of determining the operational information to be stored in the volatile storage according to the rewrite instruction signal.

7. The method of setting the information of the non-volatile memory according to claim 5, wherein the rewrite instruction signal is a program instruction signal or an erase instruction signal.

8. The method of setting the information of the non-volatile memory according to claim 1, further comprising a step of transferring the operational information stored in the non-volatile storage into the volatile storage, by writing the operational information into the volatile storage when the power is turned on.

9. Non-volatile memory comprising:
   non-volatile storage wherein operational information is stored and, when the operational information is set or updated, wherein the operational information is rewritten;
   volatile storage coupled to the nonvolatile storage for storing the operational information therein while power is supplied to the non-volatile memory; and
   a discrimination unit that outputs a logical signal on which a logical process can be done according to the operational information when rewriting of the non-volatile storage ends,
   wherein the discrimination unit is coupled to the volatile storage and the operational information is stored in the volatile storage based on the logical signal outputted by the discrimination unit.

10. The non-volatile memory according to claim 9 further comprising an amplifier coupled to the discrimination unit and the non-volatile storage for reading out stored information in the non-volatile storage and providing the stored information to the discrimination unit, wherein the logical signal to be outputted by the discrimination unit is the stored information to be read out by the amplifier, and wherein the volatile storage stores the stored information.

11. The non-volatile memory according to claim 10 wherein rewriting of the non-volatile storage is alternately and repeatedly executed until the stored information to be read out by the amplifier matches the operational information, and the stored information is stored in the volatile storage every time the amplifier reads out the stored information.

12. The non-volatile memory according to claim 10 further comprising a match judgment unit that determines whether the stored information to be read out by the amplifier matches the operational information and generating a match result therefrom, and wherein the volatile storage is coupled to the match judgment unit and stores the stored information in the volatile storage based on the match result.

13. The non-volatile memory according to claim 9 further comprising:
   a rewriting control unit coupled to the discrimination unit for controlling rewriting in accordance with direction of transition of the operational information to be set or updated; and
   a completion judgment unit coupled to the rewriting control unit for determining whether the rewriting of the non-volatile storage has been completed, and
   wherein the discrimination unit is coupled to the rewriting control unit and the logical signal to be output therefrom is a rewrite instruction signal, the rewrite instruction signal set in accordance with a direction of transition of the operational information, and
   wherein the volatile storage is coupled to the completion judgment unit and the operational information according to the rewrite instruction signal is stored in the volatile storage in accordance with a determination by the complete judgment unit.

14. The non-volatile memory according to claim 13 further comprising a rewrite information instruction unit coupled to the volatile storage and the discrimination unit for controlling the storage of the operational information in the volatile storage, in accordance with the rewrite instruction signal.

15. The non-volatile memory according to claim 13 wherein the discrimination unit outputs a rewriting instruction signal that is a program instruction signal or an erase instruction signal.

* * * * *